(12) United States Patent
Frey et al.

(10) Patent No.: US 11,830,962 B2
(45) Date of Patent: *Nov. 28, 2023

(54) METHOD FOR STRUCTURING AN INSULATING LAYER ON A SEMICONDUCTOR WAFER

(71) Applicant: AZUR SPACE Solar Power GmbH, Heilbronn (DE)

(72) Inventors: Alexander Frey, Flein (DE); Benjamin Hagedorn, Weinsberg (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/668,133

(22) Filed: Feb. 9, 2022

(65) Prior Publication Data

US 2022/0254947 A1 Aug. 11, 2022

(30) Foreign Application Priority Data

Feb. 9, 2021 (DE) ...................... 10 2021 000 640.2

(51) Int. Cl.
*H01L 31/18* (2006.01)
*H01L 31/0384* (2006.01)
(Continued)

(52) U.S. Cl.
CPC .... *H01L 31/1808* (2013.01); *H01L 31/02167* (2013.01); *H01L 31/02245* (2013.01);
(Continued)

(58) Field of Classification Search
CPC ............. H01L 31/1808; H01L 31/0384; H01L 31/02167; H01L 31/1852; H01L 31/02245; H01L 31/1868; Y02E 10/544
See application file for complete search history.

(56) References Cited

U.S. PATENT DOCUMENTS 9,680,035 B1 6/2017 Chary et al.
10,304,977 B1 5/2019 Okandan et al.
(Continued)

FOREIGN PATENT DOCUMENTS

| EP | 3787039 A1 | 3/2021 |
| WO | WO2012031078 A1 | 3/2012 |
| WO | WO2013172632 A1 | 11/2013 |

*Primary Examiner* — Ahmed N Sefer
(74) *Attorney, Agent, or Firm* — Muncy, Geissler, Olds & Lowe, P.C.

(57) ABSTRACT

A method for structuring an insulating layer on a semiconductor wafer, at least comprising the steps of: Provision of a semiconductor wafer with a top, a bottom and comprising multiple solar cell stacks, wherein each solar cell stack is a Ge substrate, which forms the bottom of the semiconductor wafer, a Ge subcell and at least two III-V subcells, in the above order, and at least one passage opening, which extends from the top to the bottom of the semiconductor wafer and has a connected side wall, an insulating layer two-dimensionally deposited on the top of the semiconductor wafer, on the side wall of the passage opening and/or on the bottom of the semiconductor wafer, and the deposition of an etch-resistant filling material by means of a printing process on an area of the top which comprises the passage opening, and into the passage opening.

4 Claims, 2 Drawing Sheets

(51) Int. Cl.
*H01L 31/0216* (2014.01)
*H01L 31/0224* (2006.01)

(52) U.S. Cl.
CPC ...... *H01L 31/0384* (2013.01); *H01L 31/1852* (2013.01); *H01L 31/1868* (2013.01); *Y02E 10/544* (2013.01)

(56) References Cited

U.S. PATENT DOCUMENTS

| | | | |
|---|---|---|---|
| 11,063,170 B2 * | 7/2021 | Koestler | H01L 31/186 |
| 11,081,615 B2 * | 8/2021 | Frey | H01L 31/02167 |
| 11,316,058 B2 * | 4/2022 | Koestler | H01L 31/02167 |
| 2006/0231130 A1 * | 10/2006 | Sharps | H01L 31/022433 |
| | | | 136/243 |
| 2014/0332067 A1 | 11/2014 | Graddy, Jr. et al. | |
| 2015/0114462 A1 | 4/2015 | Naber et al. | |
| 2017/0213922 A1 * | 7/2017 | Lucow | H01L 31/0304 |
| 2017/0345955 A1 * | 11/2017 | Chary | H01L 31/188 |
| 2017/0365732 A1 | 12/2017 | Liu et al. | |
| 2021/0066534 A1 * | 3/2021 | Koestler | H01L 31/1808 |
| 2021/0159349 A1 * | 5/2021 | Koestler | H01L 31/18 |

* cited by examiner

METHOD FOR STRUCTURING AN INSULATING LAYER ON A SEMICONDUCTOR WAFER

This nonprovisional application claims priority under 35 U.S.C. § 119(a) to German Patent Application No. 10 2021 000 640.2, which was filed in Germany on Feb. 9, 2021, and which is herein incorporated by reference.

BACKGROUND OF THE INVENTION

Field of the Invention

The present invention relates to a method for structuring an insulating layer on a semiconductor wafer.

Description of the Background Art

In order to reduce the shadowing of the front side of a solar cell, it is possible to arrange both the positive and the negative external contact area on the rear side. In the case of so-called metal wrap through (MWT) solar cells, for example, the front contact of the solar cell is guided to the rear side of the solar cell through a passage contact opening and contacted there.

Different methods for the preparation of a hole or a passage contact opening through a solar cell are known. The metallization passing through the opening is electrically insulated by means of a dielectric layer system against the layers of the solar cell stack. The dielectric layer system comprises at least one insulating layer.

For example, U.S. Pat. No. 9,680,035 B1 discloses a solar cell stack made up of multiple III-V subcells on a GaAs substrate with a back-contacted front side, wherein a hole projecting from the top of the solar cell through the subcells into a not-yet thinned substrate layer is produced by means of a wet chemical etching process. The etching process is based on the fact that the etching rates do not differ significantly, at least not for the different III-V materials of the solar cell stack that is used. Insulation and metallization of the front side and the hole is carried out before the substrate layer is thinned.

If, for example, the insulating layer is two-dimensionally deposited to the front of the solar cell stack and to the side surface of the passage contact opening, the insulating layer must be structured before the metal contacts are deposited, i.e., the insulating layer must be removed again locally.

The structuring of the insulating layer can be achieved, for example, by depositing photoresist using the spin-coating technique, photolithographic structuring of the photoresist and a subsequent wet chemical etching step. In this step, above all, the passage contact opening must be reliably protected from the etching medium.

Another possibility is to coat surfaces, in particular those with holes, with a film. Such films are available, for example, from the company DuPont as DuPont Dry Film Resists and are marketed, for example, by micro resist technology GmbH, Berlin.

SUMMARY OF THE INVENTION

It is therefore an object of the present invention to provide a method for structuring an insulating layer on a semiconductor wafer which further develops the prior art.

According to an exemplary embodiment of the invention, a method for structuring an insulating layer on a semiconductor wafer with passage openings is provided, at least comprising the steps of: provision of a semiconductor wafer with a top, a bottom and comprising multiple solar cell stacks, wherein each solar cell stack has a Ge substrate forming the bottom of the semiconductor wafer, a Ge subcell and at least two III-V subcells, in the above order, as well as at least one passage opening, which extends from the top to the bottom of the semiconductor wafer, has a connected side wall and a circumference which is oval in cross-section; two-dimensional deposition of an insulating layer on the top of the semiconductor wafer, the side wall of the passage opening and/or the bottom of the semiconductor wafer; and structured deposition of an etch-resistant filling material by means of a printing process on an area of the top which comprises the passage opening and into the passage opening.

The passage opening can be preferably oval. It should be noted that in the present case, the term "oval" also includes, in particular, round, especially circular, ovate, and elliptical forms. Also, the passage opening can be formed as a square shape with rounded corners.

Preferably, before the formation of the passage opening, the semiconductor wafer, which generally has a diameter of 100 mm or 150 mm, is thinned to the desired final thickness. For this purpose, Ge material is removed from the rear side. It goes without saying that the front side of each solar cell stack is connected from the rear side by means of one or more passage openings.

It should be noted that the term "insulating layer" can also refer in particular to a dielectric layer system comprising the insulating layer.

It should also be noted that the semiconductor wafer with a Ge substrate has at least one or more non-isolated solar cell stacks.

An advantage of the method is that in using the structured deposition of the organic filling material, no photolithographic structuring process is required to form the passage opening and reliable protection is provided for the insulating layer in the region of the passage opening. In particular, the deposition of a lacquer layer is avoided.

In other words, the passage opening and the regions adjacent to the passage opening are filled or covered on the top and/or on the bottom exclusively by means of the printing process.

Due to the structured deposition of the filling material, which is etch-resistant as compared to the insulating layer, by means of the printing process, e.g., by means of inkjet, screen printing or dispensing, time and technical effort as well as material consumption is low as compared to the state of the art. A further advantage is that reliability and yield are increased.

The method makes it possible to produce highly efficient and reliable multi-junction solar cells, the front side of which is electrically connected to the rear side, in a simple and cost-effective manner.

The etch-resistant filling material can be additionally deposited on a part of the bottom of the semiconductor wafer comprising the passage opening, and into the passage opening, before or after or during deposition on the top of the semiconductor wafer.

The term "etch-resistant" can have a lower etching rate as compared to that of the insulating layer. Preferably, the selectivity is at least 1 to 10 or at least 1 to 100.

In a further development, in the case of the passage opening, the area with etch-resistant filling material at the top and the part with etch-resistant filling material at the bottom each have an edge region which fully circumferentially surrounds the passage opening.

Further, parallel to the semiconductor wafer, the respective edge region can have a diameter at the top and/or at the bottom of at least 50 µm and at most 3.0 mm.

The edge region, parallel to the semiconductor wafer, can have a diameter of at least 100 µm and at most 1.0 mm. Preferably, the edge region has a different diameter at the top than at the bottom. In particular, the edge region has a smaller or larger diameter at the top or a diameter identical to the one at the bottom.

The insulating layer can be is removed in the areas not covered by the filling material by means of a wet chemical etching process and/or by means of an RIE (Reactive Ion Etching) process.

The insulating layer can be removed from all areas on the top and/or on the bottom of the semiconductor wafer that are not printed with filling material.

The passage opening can be completely filled by means of the printing process. In another embodiment, an elevation projecting beyond the top and beyond the bottom is formed by the filling material.

An inkjet or a screen printing process or a dispensing process can be used for the printing process. In a further development, the printing process includes a combination of different processes. Preferably, the printing process involves an inkjet process and/or a screen printing process and/or a dispensing process.

The filling material can comprise a wax and/or a lacquer and/or a resin and/or a hot melt adhesive and/or a thermoplastic.

The passage opening of the semiconductor wafer can have a total thickness of at most 500 µm and of at least 70 µm, or of at most 300 µm and of at least 80 µm.

The etch-resistant filling material can be deposited to the semiconductor wafer exclusively in the areas comprising the passage openings.

The areas for the metal contacts can have a minimum diameter or edge length of 50 µm and a maximum of 5 cm.

The passage opening can have a diameter at the top that is between 80 µm and 1 mm.

The diameter of the passage opening can taper from the top towards the bottom, wherein the tapering is preferably gradually formed.

The tapering can include exactly one stage in the passage opening or exactly two fully circumferential stages. Preferably, a first stage is formed at the boundary area between Ge subcell and the overlying III-V subcells. A second stage is preferably formed between the Ge subcell and the Ge substrate.

The passage opening can also tapers within the Ge substrate. The step-shaped or conical embodiment of the passage opening has the advantage that in particular with a preferably conform deposition of the insulating layer and/or other layers to be deposited in the context of metallization, the thickness of the layers can be sufficiently formed on the side surfaces.

A further stage can be formed at the top of the semiconductor wafer at the boundary surface between the metal structure and the top of the uppermost III-V subcell.

A part of the insulating layer can be formed on a metal structure. The metal structure is preferably or exclusively formed at the top of the semiconductor wafer.

It should be noted that the metal structure includes in particular finger structures for connecting the multi-junction solar cell to the top. In the area of the passage opening, the metal structure preferably comprises flat areas with a size of at least 10 µm to a maximum of 1.5 mm.

The flat areas of the metal structure formed below the insulating layer fully surround the passage opening. The thickness of the metal of the metal structure is in a range between 2 µm and 30 µm.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
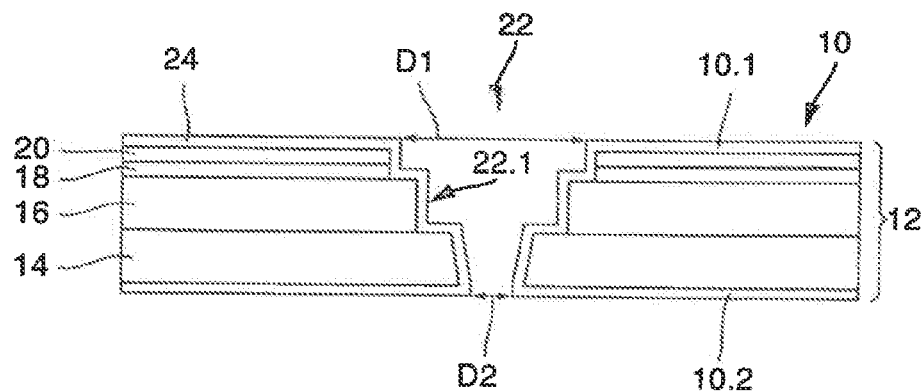
FIGS. 1a, 1b, and 1c are, in each case, a sequence of the filling of a passage opening with a subsequent etching step in cross-section.

The illustrations of FIGS. 1a, b and c show a method for structuring an insulating layer 24 on a semiconductor wafer 10 with the filling of a passage opening 22 with subsequent structuring of an insulating layer 24 on a semiconductor wafer 10.

FIG. 1a shows a cut through the unfilled passage opening 22 of the semiconductor wafer 10. The semiconductor wafer 10 has a top 10.1, a bottom 10.2 and the passage opening 22 extending from the top 10.1 to the bottom 10.2 with a connected side wall 22.1.

The top 10.1 and the side wall 22.1 and the bottom 10.2 are completely covered with the insulating layer 24, wherein the insulating layer 24 covers the upper surfaces completely. It is understood that the insulating layer 24 is preferably formed as a layer system with multiple layers.

The semiconductor wafer 10 comprises at least one, although generally multiple, not-yet isolated solar cell stacks 12, each with a layer sequence formed of a Ge substrate 14 forming the bottom 10.2, a Ge subcell 16, a first III-V subcell 18 and a second III-V subcell 20 which forms the top 10.1.

In a plan view, not shown, the passage opening 22 has a nearly circular cross-section, wherein the layers shown are circumferential, both at the top 10.1 and in the passage opening 22 as well as on the bottom 10.2.

At the top 10.1, the passage opening 22 has a first diameter D1, and at the bottom 10.2, a second diameter D2. The first diameter D1 is larger than the second diameter D2. The tapering of the passage opening 22 from the top 10.1 to the bottom 10.2 takes place in several fully circumferential stages. In the present embodiment, the tapering comprises exactly two stages.

In one embodiment, not shown, the first diameter D1 is smaller than the second diameter D2.

Seen from the direction of the top 10.1, the first stage is at a boundary between the lowest III-V subcell 18 and the Ge subcell 16. The second stage is formed between the Ge subcell 16 and the Ge-substrate 14.

Preferably, the passage opening 22 also tapers within the Ge substrate 14. The step-shaped or conical embodiment of the passage opening has the advantage that in particular in the case of a preferably conformal deposition of the insulating layer 10 and/or other layers to be deposited, in the context of metallization, it is possible to sufficiently form the thickness of the layers on the side surfaces.

Figure 1B:
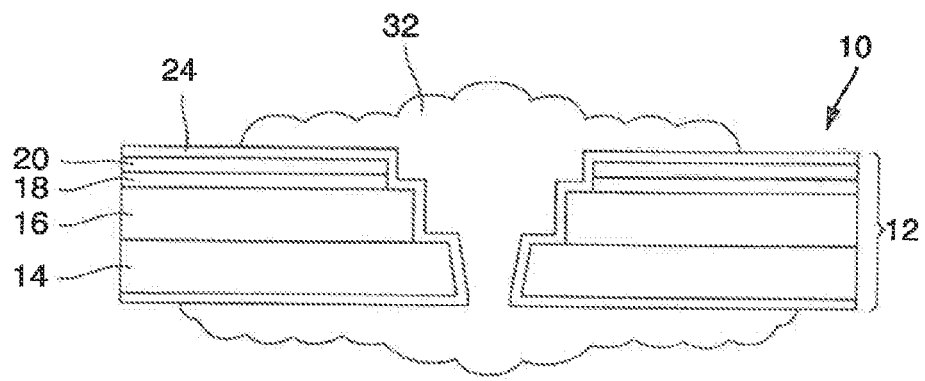

In a further method step, shown in the illustration of FIG. 1b, a filling material 32, which is etch-resistant as compared to the insulating layer, is deposited by means of a printing process on an area of the top 10.1 of the passage opening 22 which comprises the passage opening 22.

The filling material not only fully fills the passage opening 22 up to the top 10.1 of the semiconductor wafer, but also forms in each case a projecting elevation on the top 10.1 as well as on the bottom 10.2. On the bottom 10.2, the filling material 32 covers a larger edge region than on the top 10.1.

Figure 1C:
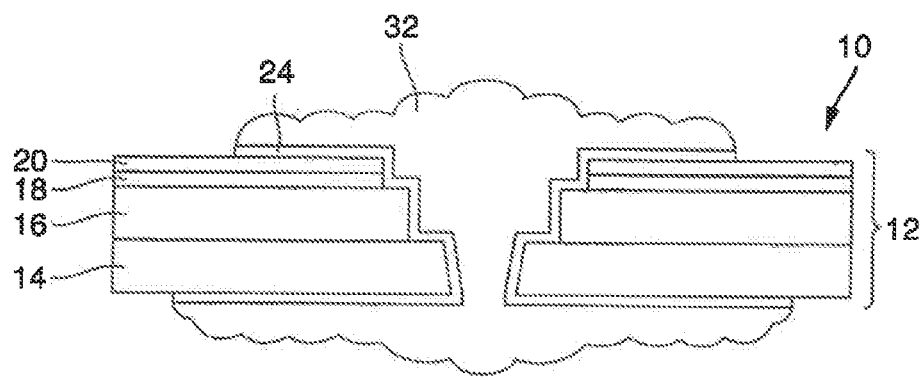

By means of a subsequent etching step, the insulating layer 24 is etched away in the areas not covered with the filling material 32, as shown in the result in FIG. 1c.

Figure 2:
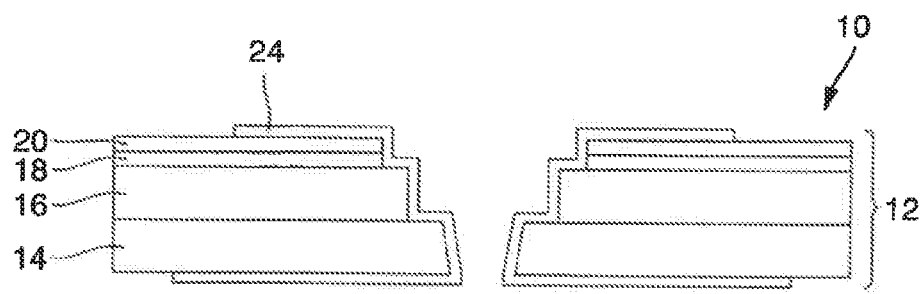
FIG. 2 is a cross-section of a structured insulating layer with an exposed passage opening.

The illustration of FIG. 2 shows the cross-section of an insulating layer structured by means of the inventive method on a semiconductor wafer with a passage opening. In the following, only the differences to the illustrations of FIG. 1 are explained.

In a further method step, the filling material 32 is completely removed.

Figure 3:
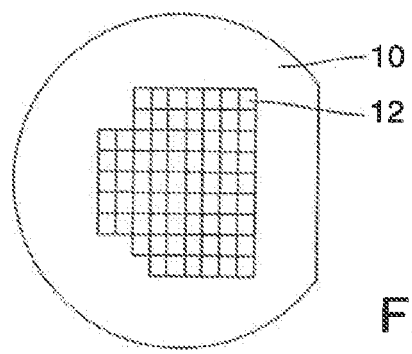
FIG. 3 is a view of a semiconductor wafer with a plurality of solar cell stacks.

FIG. 3 shows a view of a semiconductor wafer 10 with multiple solar cell stacks 12. It is understood that in each area of each solar cell stack at least one hole is formed, which is processed by means of the method.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for structuring an insulating layer on a semiconductor wafer with a passage opening on a semiconductor wafer, the method comprising:
    providing a semiconductor wafer with a top and a bottom and comprising at least two solar cell stacks, each of the at least two solar cell stacks comprising:
        a Ge substrate forming the bottom of the semiconductor wafer;
        a Ge subcell and at least two III-V subcells, in the above order; and
        as well as at least one passage opening, which extends from the top to the bottom of the semiconductor wafer and has a connected side wall;
    depositing, two-dimensionally, an insulating layer on the top of the semiconductor wafer, on the side wall of the passage opening, and/or on the bottom of the semiconductor wafer; and
    depositing an etch-resistant filling material via a printing process on an area of the top that comprises the passage opening, and into the passage opening.

2. The method according to claim 1, wherein the etch-resistant filling material, before or after or during the deposition on the top of the semiconductor wafer, is additionally deposited on a part of the bottom of the semiconductor wafer which comprises the passage opening, and into the passage opening.

3. The method according to claim 1, wherein the printing process is an inkjet process, a sieve printing method, or a dispensing method.

4. The method according to claim 1, wherein the etch-resistant filling material is a wax, a lacquer, a resin, a hot melt adhesive or a thermoplastic.

* * * * *